(12) United States Patent
Liang et al.

(10) Patent No.: US 7,382,308 B1
(45) Date of Patent: Jun. 3, 2008

(54) REFERENCE BUFFER USING CURRENT MIRRORS AND SOURCE FOLLOWERS TO GENERATE REFERENCE VOLTAGES

(75) Inventors: Enzhu Liang, Davis, CA (US); Xuecheng Jin, Palo Alto, CA (US)

(73) Assignee: iWatt Inc., Los Gatos, CA (US)

( * ) Notice: Subject to any disclaimer, the term of this patent is extended or adjusted under 35 U.S.C. 154(b) by 0 days.

(21) Appl. No.: 11/676,026

(22) Filed: Feb. 16, 2007

(51) Int. Cl.
*H03M 1/38* (2006.01)

(52) U.S. Cl. .................. 341/161; 341/135; 341/162; 341/163; 327/541; 327/543; 323/315; 323/316

(58) Field of Classification Search ................. 341/135
See application file for complete search history.

(56) References Cited

U.S. PATENT DOCUMENTS

| | | | |
|---|---|---|---|
| 5,177,451 A | 1/1993 | Lehmann | |
| 5,854,574 A | 12/1998 | Singer et al. | |
| 6,204,724 B1 * | 3/2001 | Kobatake | 327/541 |
| 6,486,820 B1 * | 11/2002 | Allworth et al. | 341/161 |
| 6,577,185 B1 * | 6/2003 | Chandler et al. | 330/9 |
| 6,900,689 B2 * | 5/2005 | Kimura | 327/542 |
| 7,173,481 B2 * | 2/2007 | Kimura | 327/541 |
| 7,215,182 B2 * | 5/2007 | Ali | 327/538 |
| 7,268,720 B1 * | 9/2007 | Murden et al. | 341/161 |
| 2007/0164810 A1 * | 7/2007 | Chen | 327/541 |

* cited by examiner

*Primary Examiner*—Khai M Nguyen
(74) *Attorney, Agent, or Firm*—Fenwick & West LLP

(57) ABSTRACT

A reference buffer includes a first current mirror, a second current mirror, a first source follower coupled in series to a branch of the first current mirror and receiving a first initial reference voltage and outputting a first reference voltage, a second source follower coupled in series to a branch of the second current mirror and receiving a second initial reference voltage and outputting a second reference voltage, and a resistor coupled between a first node and a second node outputting the first and second reference voltages, respectively. The first node is disposed between the first current mirror and the first source follower and the second node is disposed between the second current mirror and the second source follower. The voltage difference between the first reference voltage and the first initial reference voltage is substantially same as that between the second reference voltage and the second initial reference voltage.

17 Claims, 3 Drawing Sheets

REFERENCE BUFFER USING CURRENT MIRRORS AND SOURCE FOLLOWERS TO GENERATE REFERENCE VOLTAGES

BACKGROUND OF THE INVENTION

1. Field of the Invention

The present invention relates to a reference buffer and, more specifically, to an on-chip CMOS reference buffer generating reference voltages for use in a pipelined analog to digital converter.

2. Description of the Related Art

Pipelined analog to digital converters (ADC) are widely used in a variety of electronic devices. A pipelined analog to digital converter divides the analog-to-digital conversion task into several consecutive stages. FIG. 1A is a simplified block diagram illustrating a conventional pipelined ADC 100, and FIG. 1B is a simplified block diagram illustrating one of the m-bit analog-to-digital conversion stages of the pipelined ADC 100. The pipelined ADC 100 includes a sample and hold circuit 102, and a plurality (p) of m-bit analog-to-digital conversion (ADC) stages 104, 106, ..., 108. The sample-and hold circuit 102 holds the analog input voltage ($V_{IN}$) while the ADC stages 104, 106, ..., 108 convert the analog input voltage ($V_{IN}$) to a digital voltage value having n=p×m bits. The ADC stages 104, 106, ..., 108 have identical structures, one of which is shown in FIG. 1B. In FIG. 1B, the notation "A" refers to analog signals and the notation "D" refers to digital signals.

As shown in FIG. 1B, each of these ADC stages 104, 106, ..., 108 is comprised of a sample and hold circuit 152, an m-bit ADC (e.g., a flash converter) 154, an m-bit D/A converter (DAC) 156, and an amplifier 160 with a gain of $2^m$. These ADC stages are usually referred to as Multiplying DACs (MDACs). FIG. 1B is illustrated with reference to the first ADC stage 104, but the other ADC stages have substantially same structures. First, the sample and hold circuit 152 acquires the analog input voltage ($V_{IN}$). The m-bit ADC (flash converter including comparators) 154 converts the sampled analog input voltage ($V_{IN}$) signal 153 to m-bit digital data 155, which forms the most significant bits of the digital output. The m-bit digital data 155 is added to the digital data output from the preceding ADC stage (which does not exist in the case of the first stage 104) to generate the accumulated digital output 167 from the first stage to this ADC stage. Referring back to FIG. 1A, note that a time alignment circuit 110 may time-align the digital outputs from the ADC stages 104, 106, ..., 108 before adding them up. This same m-bit digital data 155 is fed into an m-bit digital-to-analog converter 156, and its output 157 is subtracted from the original sampled signal 159 by the subtractor 158. The residual analog signal 161 is then amplified by the amplifier 160, and the amplified residual analog signal 163 is sent on to the next ADC stage in the pipeline to be sampled and converted in the same manner. This process is repeated through as many stages as are necessary to achieve the desired resolution.

In principle, a pipelined converter with p pipelined stages, each with an m-bit flash converter, can produce a high-speed ADC with a resolution of n=p×m bits using p×($2^m$−1) comparators in the flash converter ADC 154. For example, a 2-stage pipelined converter with 8-bit resolution requires 30 comparators, and a 4-stage 16-bit ADC requires only 60 comparators. In practice, however, a few additional bits are generated to provide for error correction. Note that as soon as a certain ADC stage finishes processing a sample, it can start processing the next sample while the subsequent ADC stages processes the previous sample, due to the sample-and-hold circuitry 152 embedded within each ADC stage. Such pipelining action accounts for the high throughput.

Referring back to FIGS. 1A and 1B, the pipelined ADCs typically require 3 reference voltages, VREFP, VREFN, and VCOM for use in comparators of the flash converter ADCs 154. In general, VREFP, VREFN, and VCOM in a pipelined ADC satisfy the following relationship:

VREFP>VREFN $VCOM=(VREFP+VREFN)/2$

These reference voltages VREFP, VREFN, and VCOM typically suffer from dynamic kickback from the MDACs and need to settle within the required accuracy for a given number of bits for an ADC within half of the sampling clock period. Typically, the reference voltages are buffered with buffers compensated by external capacitors. FIG. 2 illustrates a conventional reference buffer 200 that modifies and amplifies an initial reference voltage VREFi to generate a reference voltage $V_{REF}$ for use in a pipelined ADC. In the circuitry of FIG. 2, VREFi could be one of VREFPi, VREFNi, and VCOMi, and $V_{REF}$ could be one of VREFP, VREFN, and VCOM. Therefore, it is necessary to have three such conventional reference buffers as illustrated in FIG. 2 to generate all 3 reference voltages VREFP, VREFN, and VCOM for use in a pipelined ADC.

Referring to FIG. 2, the reference buffer 200 is comprised of a buffer 202, a current source, 206, and a transistor 204, which are typically on-chip on the pipelined ADC chip. The buffer 202 receives an initial reference voltage VREFi at the negative input of the buffer 202. The buffer 202 and the transistor 204 form a two-stage amplifier and its driving capability is controlled by its biasing current IB 206.

Note that an external capacitor CEXT 208 is coupled between node 210 and ground (GND) through a pin on the IC (integrated circuit) in a conventional reference buffer 200. The external capacitor 208 is a compensation capacitor for keeping the node 210 at low impedance, providing loop stability, and reducing charge injection to the reference buffer 200. However, adding this external capacitor 208 adds significant cost to the reference buffer 200, and the parasitic inductance caused by the IC pin dedicated to the external capacitor 208 degrades the performance of the pipelined ADC.

Therefore, there is a need for a reference buffer that does not require an external capacitor at its output node.

SUMMARY OF THE INVENTION

Embodiments of the present invention include a reference buffer comprising a first current mirror formed by a first transistor and a second transistor, the first transistor driven by a first current generated by a constant current source and the second transistor driven by a second current proportional to the first current; a second current mirror formed by the first transistor and a third transistor, the third transistor driven by a third current proportional to the first current; a first source follower coupled in series to the second transistor and receiving a first initial reference voltage and outputting a first reference voltage; a second source follower coupled in series to the third transistor and receiving a second initial reference voltage and outputting a second reference voltage; and a first resistor coupled between a first node and a second node, the first node disposed between the second transistor and the first source follower and the second node disposed between the third transistor and the second source follower. The voltage difference between the first reference voltage and the first initial reference voltage is substantially same as the voltage difference between the second reference voltage and the second initial reference voltage. Thus, the voltage difference between the first initial reference voltage and the second initial reference voltage is maintained as the voltage difference between the first reference voltage and the second reference voltage. The first reference voltage is output from the first node and the second reference voltage is output from the second node.

The gate-source voltage difference in the first source follower is substantially the same as the gate-source voltage difference in the second source follower. The sizes of the second transistor and the third transistor are adjusted to force the voltage difference between the first reference voltage and the first initial reference voltage to be substantially same as the voltage difference between the second reference voltage and the second initial reference voltage.

In one embodiment, the first current is $I_B$, the second current is $K_1 \times I_B$, and the third current is $K_2 \times I_B$, where $K_1$ and $K_2$ are constants proportional to the sizes of the second transistor and the third transistor, respectively, relative to the size of the first transistor. In one embodiment, the first current $I_B = V_{BG}/R_B$, where $V_{BG}$ is a temperature-independent bandgap voltage and $R_B$ is the resistance of a second resistor used to generate the first current. $K_1$ and $K_2$ have the following relationship:

$$K_1 - K_2 = \frac{2\beta V_{REF}}{V_{BG}},$$

where $$\beta = \frac{R_B}{R_C},$$

$R_C$ is the value of the first resistor, and $V_{REF}$ is another voltage difference between the first reference voltage and the second reference voltage.

In still another embodiment, the reference buffer is used to generate three reference voltages for a pipelined analog-to-digital converter. In such embodiment, the reference buffer further comprises a third current mirror formed by the first transistor and a fourth transistor, the fourth transistor driven by a fourth current proportional to the first current; and a third source follower coupled in series to the fourth transistor and receiving a third initial reference voltage and outputting a third reference voltage, where the voltage difference between the third reference voltage and the third initial reference voltage is substantially same as the voltage difference between the second reference voltage and the second initial reference voltage and as the voltage difference between the first reference voltage and the first initial reference voltage.

In this embodiment, the first current is $I_B$, the second current is $K_1 \times I_B$, the third current is $K_2 \times I_B$, and the fourth current is $K_3 \times I_B$, said $K_1$, $K_2$, and $K_3$ being constants proportional to the sizes of the second transistor, the third transistor, the fourth transistor, respectively, relative to the size of the first transistor. If the first current is $I_B = V_{BG}/R_B$, where $V_{BG}$ is a temperature-independent bandgap voltage and $R_B$ is the resistance of a second resistor used to generate the first current, $K_1$, $K_2$, and $K_3$ have the following relationship:

$$K_1 - K_2 = \frac{2\beta V_{REF}}{V_{BG}}$$

and $K_1 + K_2 = 2K_3$, where $$\beta = \frac{R_B}{R_C},$$

$R_C$ is the value of the first resistor, and $V_{REF}$ is another voltage difference between the first reference voltage and the second reference voltage. In this embodiment, the first reference voltage is larger than the second reference voltage, and the third reference voltage is equal to the average of the first reference voltage and the second reference voltage.

The reference buffer of the present invention can generate two or more reference voltages using a single piece of circuitry. Because source followers are used, the reference buffer has a wide bandwidth and no external capacitor is needed to stabilize the nodes of the output reference voltages. The bandwidth and output impedance of the reference buffer can be controlled by adjusting the sizes of the MOSFETS forming the current mirror to meet fast speed, high resolution requirements.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present invention can be readily understood by considering the following detailed description in conjunction with the accompanying drawings.

DETAILED DESCRIPTION OF EMBODIMENTS

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 1A:
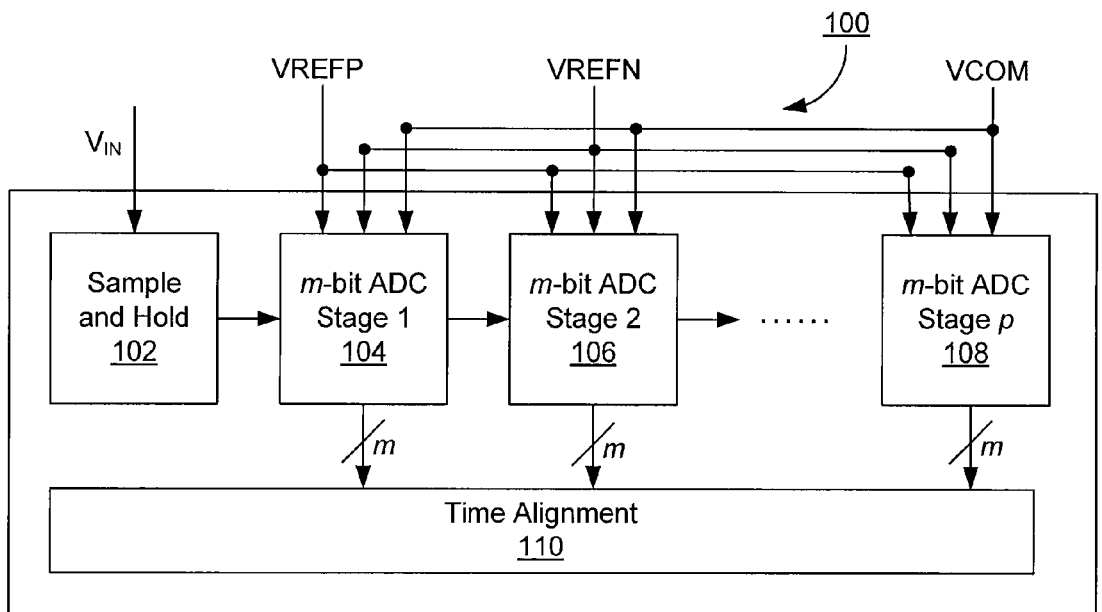
FIG. 1A is a simplified block diagram illustrating a conventional pipelined ADC.
Figure 1B:
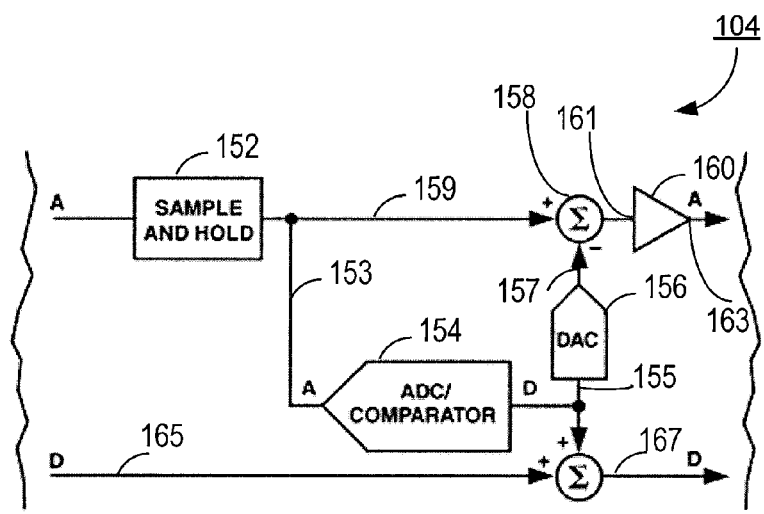
FIG. 1B is a simplified block diagram illustrating one of the m-bit analog-to-digital conversion stages of the pipelined ADC.
Figure 2:
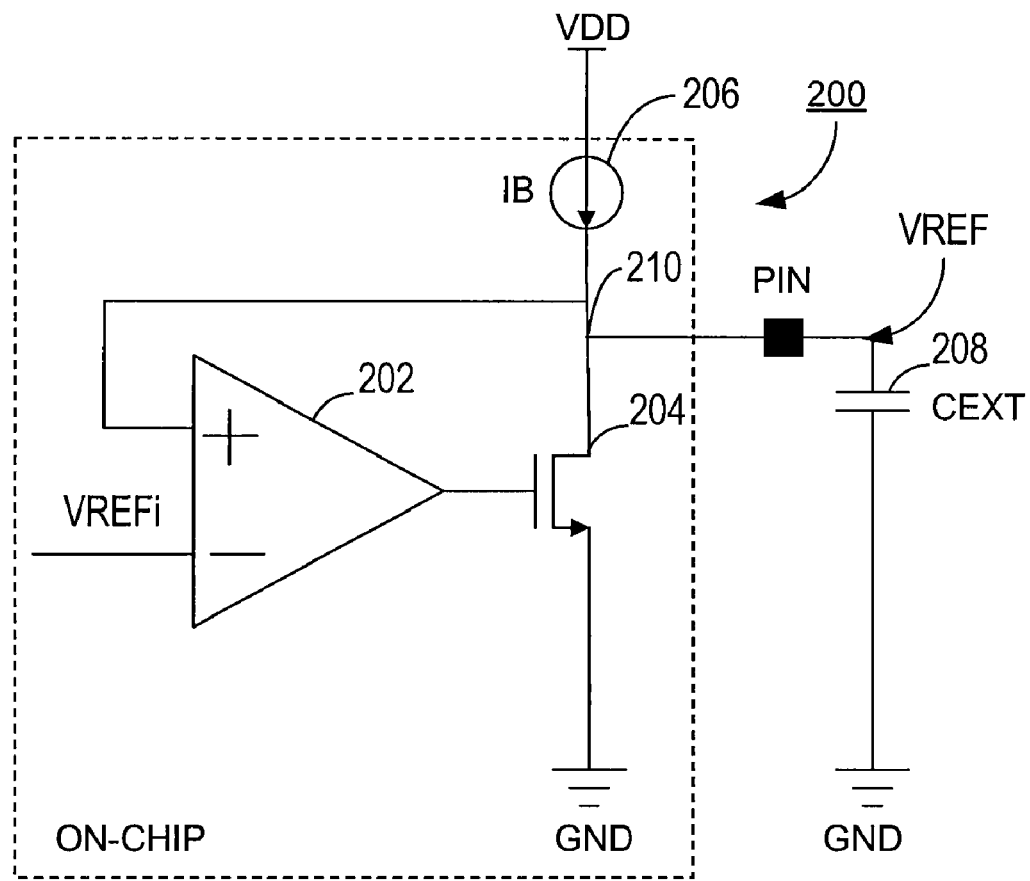
FIG. 2 illustrates a conventional reference buffer that buffers an initial reference voltage VREFi to generate a reference voltage VREF for use in a pipelined ADC.
Figure 3:
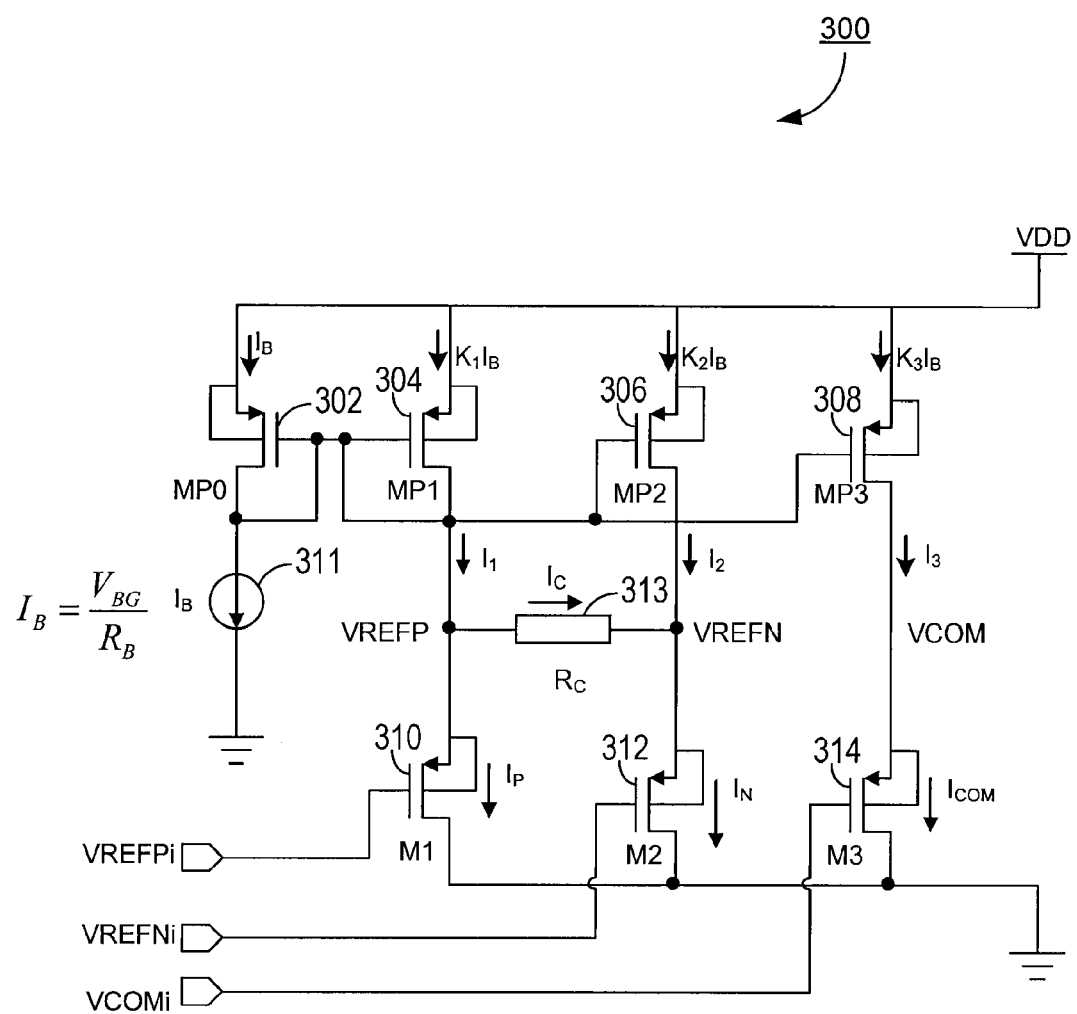
FIG. 3 illustrates a reference buffer that generates reference voltages for use in a pipelined ADC, according to one embodiment of the present invention.

FIG. 3 illustrates a reference buffer 300 that generates reference voltages for use in a pipelined ADC, according to one embodiment of the present invention. The reference buffer 300 receives three initial reference voltages VREFPi, VREFNi, and VCOMi and modifies and amplifies them respectively to generate all three of the reference voltages VREFP, VREFN, and VCOM for use in pipelined ADCs. The reference buffer 300 includes p-type MOSFETs (Metal Oxide Semiconductor Field Effect Transistors) 302 (MP0), 304 (MP1), 306 (MP2), 308 (MP3), 310 (M1), 312 (M2), 314 (M3), a current source 311, and a resistor ($R_C$) 313.

The MOSFET 302 forms a reference current branch driven by a reference current $I_B$ generated by the current source 311. $I_B$ is generated using a temperature-independent bandgap voltage $V_{BG}$ across a resistor $R_B$ (not shown), where $I_B=V_{BG}/R_B$. MOSFETS 302, 304 form a first current mirror, with the MOSFET 304 generating a current $I_1=K_1 I_B$ where $K_1$ is a constant representative of the size of MOSFET 304 relative to the size of MOSFET 302. MOSFETS 302, 306 form a second current mirror, with the MOSFET 306 generating a current $I_2=K_2 I_B$ where $K_2$ is a constant representative of the size of MOSFET 306 relative to the size of MOSFET 302. MOSFETS 302, 308 form a third current mirror, with the MOSFET 308 generating a current $I_3=K_3 I_B$ where $K_3$ is a constant representative of the size of MOSFET 308 relative to the size of MOSFET 302. The gates of the MOSFETs 304, 306, 308 are tied together and the sources of the MOSFETs 302, 304, 306, 308 are coupled to a supply voltage VDD. The resistor 313 is coupled between a first node and a second node, where the first node is disposed between the drain of MOSFET 304 and the source of MOSFET 310 and the second node is disposed between the drain of the MOSFET 306 and the source of the MOSFET 312. A current $I_C$=(VREFP−VREFN)/$R_C$ flows through the resistor 313 from the first node to the second node.

The MOSFETs 310, 312, 314 are source followers. MOSFET 310 is a source follower with its gate driven by a first initial reference voltage VREFPi and outputting a first reference voltage VREFP at its source, where VREFP=VREFPi+|$V_{GS,310}$| (gate-source voltage of MOSFET 310). Current $I_P$ flows through MOSFET 310. MOSFET 312 is a source follower with its gate driven by a second initial reference voltage VREFNi and outputting a second reference voltage VREFN at its source, where VREFN=VREFNi+|$V_{GS,312}$| (gate-source voltage of MOSFET 312). Current $I_N$ flows through MOSFET 312. MOSFET 314 is a source follower with its gate driven by a third initial reference voltage VCOMi and outputting a third reference voltage VCOM at its source, where VCOM=VCOMi+|$V_{GS,314}$| (gate-source voltage of MOSFET 314). Current $I_{COM}$ flows through MOSFET 314.

It is assumed that the threshold turn-on voltages of the MOSFETs 310, 312, 314 are identical, because they would be fabricated on an integrated circuit using the same process. In order for the reference buffer to properly perform its function, the difference in voltages between VREFPi, VREFNi, and VCOMi should be maintained even after they are amplified and modified to VREFP, VREFN, VCOM, which will be used by the pipelined ADC. This can be accomplished by adjusting the size of the MOSFETs 304, 306, 308 (the constants $K_1$, $K_2$, $K_3$) and its resulting currents $I_1$, $I_2$, $I_3$, so that the gate-source voltages of the MOSFETs 310, 312, 314 are identical, by the following calculations.

In a pipelined ADC, VREFP, VREFN, and VCOM should satisfy the following relationship: VREFP>VREFN and VCOM=(VREFP+VREFN)/2.

The transconductance $g_m$ of each of the MOSFETs 310, 312, 314 for bandwidth and settling is:

$$g_m = \sqrt{2\mu C_{ox} \frac{W}{L} I}, \quad (1)$$

where μ is electron mobility, $C_{ox}$ is the capacitance per unit area of the gate oxide, I is the drain current of the MOSFET, and W/L is the width to length ratio of the MOSFET. The gate-source voltage shift |$V_{GS}$| in each of the source followers 310, 312, 314 is defined as:

$$|V_{GS}| = |V_{th}| + \sqrt{\frac{2I}{\mu C_{ox} \frac{W}{L}}}, \quad (2)$$

where $V_{th}$ is the threshold turn-on voltage of the MOS transistors 310, 312, 314. In order to have identical gate-source voltage shifts |$V_{GS}$| in each of the source followers 310, 312, 314, the drain current $I_P$, $I_N$, $I_{COM}$ through the source followers 310, 312, 314 should be equal.

Assuming that on-chip polysilicon resistors that track each other are used, and define:

$$\beta = \frac{R_B}{R_C}. \quad (3)$$

Also define $V_{REF}$=VREFP−VFEFN.

It follows that the current $I_C$ through the resistor 313 is:

$$I_C = \frac{V_{REF}}{R_C}. \quad (4)$$

Also, the bias current, $I_B$, is generated using a temperature independent bandgap voltage, $V_{BG}$, where:

$$I_B = \frac{V_{BG}}{R_B}. \quad (5)$$

Using current summation, it follows:

$$I_P = \frac{V_{BG}}{R_B}K_1 - I_C = \frac{V_{BG}}{\beta R_C}K_1 - \frac{V_{REF}}{R_C} = \left(\frac{V_{BG}K_1}{\beta} - V_{REF}\right)\frac{1}{R_C} \quad (6)$$

$$I_N = \frac{V_{BG}}{R_B}K_2 + I_C = \frac{V_{BG}}{\beta R_C}K_2 + \frac{V_{REF}}{R_C} = \left(\frac{V_{BG}K_2}{\beta} + V_{REF}\right)\frac{1}{R_C} \quad (7)$$

$$I_{COM} = \left(\frac{V_{BG}}{R_B}\right)K_3. \quad (8)$$

Since $I_P = I_N = I_{COM}$ and $I_P + I_N = 2I_{COM}$, from Equations (6), (7) and (8), it follows:

$$\frac{V_{BG}K_1}{\beta} - V_{REF} = \frac{V_{BG}K_2}{\beta} + V_{REF} \quad (9)$$

$$K_1 - K_2 = \frac{2\beta V_{REF}}{V_{BG}} \quad (10)$$

$$K_1 + K_2 = 2K_3. \quad (11)$$

Since $\beta$, $V_{BG}$, and $V_{REF}$ are known values, once $K_1$ is set by the bandwidth and settling requirement, $K_2$ can be obtained from equation (10). Therefore, $K_3$ can be obtained from equation (11) once $K_1$ and $K_2$ are set. The values of $K_1$, $K_2$ and $K_3$ set in this manner will cause the drain currents of the equal-size source followers 310, 312, 314 to satisfy $I_P = I_N = I_{COM}$, resulting in equal gate-source voltage shifts |VGS| in each of the source followers 310, 312, 314. Therefore, the reference buffer 300 achieves the following relationship:

VREFP=VREFPi+|VGS|

VREFN=VREFNi+|VGS|

VCOM=VCOMi+|VGS|.

Note that the reference buffer 300 of the present invention generates all three of the reference buffer using a single piece of circuitry as shown in FIG. 3. The strength of the reference buffer can be adjusted by adjusting the sizes of the MOSFETS 304, 306, 308 as long as they satisfy the relations in equations (10) and (11). Because source followers are used, the reference buffer 300 has a wide bandwidth and no external capacitor is needed to stabilize the nodes of the output reference voltages. The bandwidth and output impedance of the reference buffer 300 can be controlled by adjusting the sizes of the MOSFETS forming the current mirror to meet fast speed, high resolution requirements.

Upon reading this disclosure, those of ordinary skill in the art will appreciate still additional alternative structural and functional designs for a reference buffer through the disclosed principles of the present invention. For example, although the reference buffer is described herein for use in generating reference voltages for a pipelined ADC, the reference buffer can be used in other applications where fast settling is necessary. Although three reference voltages are generated in the embodiment of FIG. 3, the reference buffer may be modified to generate merely two reference voltages VREFP, VREFN by simply eliminating the third current mirror branch 308 and the third source follower 314, or to generate more than three reference voltages by adding additional current mirror-source follower branches.

Thus, while particular embodiments and applications of the present invention have been illustrated and described, it is to be understood that the invention is not limited to the precise construction and components disclosed herein. Various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A reference buffer comprising:
a first current mirror formed by a first transistor and a second transistor, the first transistor driven by a first current generated by a constant current source and the second transistor driven by a second current proportional to the first current;
a second current mirror formed by the first transistor and a third transistor, the third transistor driven by a third current proportional to the first current;
a first source follower coupled in series to the second transistor and receiving a first initial reference voltage and outputting a first reference voltage;
a second source follower coupled in series to the third transistor and receiving a second initial reference voltage and outputting a second reference voltage; and
a first resistor coupled between a first node and a second node, the first node disposed between the second transistor and the first source follower and the second node disposed between the third transistor and the second source follower, and wherein:
a voltage difference between the first reference voltage and the first initial reference voltage is substantially same as the voltage difference between the second reference voltage and the second initial reference voltage.

2. The reference buffer of claim 1, wherein a first gate-source voltage difference in the first source follower is substantially the same as a second gate-source voltage difference in the second source follower.

3. The reference buffer of claim 1, wherein the sizes of the second transistor and the third transistor are adjusted to force the voltage difference between the first reference voltage and the first initial reference voltage to be substantially same as the voltage difference between the second reference voltage and the second initial reference voltage.

4. The reference buffer of claim 1, wherein the first current is $I_B$, the second current is $K_1 \times I_B$, and the third current is $K_2 \times I_B$, said $K_1$ and $K_2$ being constants proportional to the sizes of the second transistor and the third transistor, respectively, relative to the size of the first transistor.

5. The reference buffer of claim 4, wherein the first current $I_B = V_{BG}/R_B$, $V_{BG}$ being a temperature-independent bandgap voltage and $R_B$ being the resistance of a second resistor used to generate the first current.

6. The reference buffer of claim 5, wherein $K_1$ and $K_2$ have the following relationship:

$$K_1 - K_2 = \frac{2\beta V_{REF}}{V_{BG}},$$

where $$\beta = \frac{R_B}{R_C},$$

$R_C$ is the resistance of the first resistor, and $V_{REF}$ is another voltage difference between the first reference voltage and the second reference voltage.

7. The reference buffer of claim 1, wherein the first reference voltage is output from the first node and the second reference voltage is output from the second node.

8. The reference buffer of claim 1, further including:
a third current mirror formed by the first transistor and a fourth transistor, the fourth transistor driven by a fourth current proportional to the first current; and
a third source follower coupled in series to the fourth transistor and receiving a third initial reference voltage and outputting a third reference voltage, the voltage difference between the third reference voltage and the third initial reference voltage being substantially same as the voltage difference between the second reference voltage and the second initial reference voltage and as the voltage difference between the first reference voltage and the first initial reference voltage.

9. The reference buffer of claim 8, wherein the first current is $I_B$, the second current is $K_1 \times I_B$, the third current is $K_2 \times I_B$, and the fourth current is $K_3 \times I_B$, said $K_1$, $K_2$, and $K_3$ being constants proportional to the sizes of the second transistor, the third transistor, the fourth transistor, respectively, relative to the size of the first transistor.

10. The reference buffer of claim 9, wherein the first current $I_B = V_{BG}/R_B$, $V_{BG}$ being a temperature-independent bandgap voltage and $R_B$ being the resistance of a second resistor used to generate the first current, and $K_1$, $K_2$, and $K_3$ have the following relationship:

$$K_1 - K_2 = \frac{2\beta V_{REF}}{V_{BG}} \text{ and } K_1 + K_2 = 2K_3,$$

where $$\beta = \frac{R_B}{R_C},$$

$R_C$ is the resistance of the first resistor, $V_{REF}$ is another voltage difference between the first reference voltage and the second reference voltage.

11. The reference buffer of 8, wherein the first reference voltage is larger than the second reference voltage, and the third reference voltage is equal to the average of the first reference voltage and the second reference voltage.

12. The reference buffer of claim 11, wherein the first reference voltage, the second reference voltage, and the third reference voltage are used in a pipelined analog-to-digital converter.

13. The reference buffer of claim 1, wherein the drains of the first source follower and the second source follower are coupled to a common node.

14. A pipelined analog-to-digital converter comprising:
a plurality of analog-to-digital converter stages using a first reference voltage, a second reference voltage, and a third reference voltage; and
a reference buffer including:
a first current mirror formed by a first transistor and a second transistor, the first transistor driven by a first current generated by a constant current source and the second transistor driven by a second current proportional to the first current;
a second current mirror formed by the first transistor and a third transistor, the third transistor driven by a third current proportional to the first current;
a third current mirror formed by the first transistor and a fourth transistor, the fourth transistor driven by a fourth current proportional to the first current;
a first source follower coupled in series to the second transistor and receiving a first initial reference voltage and outputting the first reference voltage;
a second source follower coupled in series to the third transistor and receiving a second initial reference voltage and outputting a second reference voltage;
a third source follower coupled in series to the fourth transistor and receiving a third initial reference voltage and outputting a third reference voltage; and
a first resistor coupled between a first node and a second node, the first node disposed between the second transistor and the first source follower and the second node disposed between the third transistor and the second source follower, and wherein:
the voltage difference between the third reference voltage and the third initial reference voltage being substantially same as the voltage difference between the second reference voltage and the second initial reference voltage and as the voltage difference between the first reference voltage and the first initial reference voltage.

15. The pipelined analog-to-digital converter of claim 14, wherein the first current is $I_B$, the second current is $K_1 \times I_B$, the third current is $K_2 \times I_B$ and the fourth current is $K_3 \times I_B$, said $K_1$, $K_2$, and $K_3$ to the sizes of the second transistor, the third transistor, the fourth transmitter, respectively, relative to the size of the first transistor.

16. The pipelined analog-to-digital converter of claim 15, wherein the first current $I_B = V_{BG}/R_B$, $V_{BG}$ being a temperature-independent bandgap voltage and $R_B$ being the resistance of a second resistor used to get the first current, and $K_1$, $K_2$, and $K_3$ have the following relationship:

$$K_1 - K_2 = \frac{2\beta V_{REF}}{V_{BG}} \text{ and } K_1 + K_2 = 2K_3,$$

where $$\beta = \frac{R_B}{R_C},$$

$R_C$ is the resistance of the first resistor, $V_{REF}$ is another voltage difference between the first reference voltage and the second reference voltage.

17. The pipelined analog-to-digital converter of claim 14, wherein the first reference voltage is larger than the second reference voltage, and the third reference voltage is equal to the average of the first reference voltage and the second reference voltage.

* * * * *

UNITED STATES PATENT AND TRADEMARK OFFICE
CERTIFICATE OF CORRECTION

PATENT NO. : 7,382,308 B1  Page 1 of 1
APPLICATION NO. : 11/676026
DATED : June 3, 2008
INVENTOR(S) : Enzhu Liang and Xuecheng Jin It is certified that error appears in the above-identified patent and that said Letters Patent is hereby corrected as shown below:

1. Column 10, Line 37, add --being constants proportional-- between the phrases "said $K_1$, $K_2$, and $K_3$" and "to the sizes of the second transistor,"

2. Column 10, Line 43, replace "get" with --generate--

Signed and Sealed this

Nineteenth Day of August, 2008

JON W. DUDAS
*Director of the United States Patent and Trademark Office*